United States Patent
Ghioni et al.

(10) Patent No.: US 10,146,275 B2
(45) Date of Patent: Dec. 4, 2018

(54) 3D PRINTED THERMAL MANAGEMENT SYSTEM

(71) Applicant: Microsoft Technology Licensing, LLC, Redmond, WA (US)

(72) Inventors: Lincoln Ghioni, Redmond, WA (US); Jeffrey Taylor Stellman, San Francisco, CA (US); Andrew Hill, Redmond, WA (US); Kurt Jenkins, Sammamish, WA (US); Robyn Rebecca Reed McLaughlin, Seattle, WA (US)

(73) Assignee: Microsoft Technology Licensing, LLC, Redmond, WA (US)

(*) Notice: Subject to any disclaimer, the term of this patent is extended or adjusted under 35 U.S.C. 154(b) by 0 days.

(21) Appl. No.: 15/046,441

(22) Filed: Feb. 17, 2016

(65) Prior Publication Data
US 2017/0235349 A1 Aug. 17, 2017

(51) Int. Cl.
*H01L 23/427* (2006.01)
*H01L 23/367* (2006.01)
(Continued)

(52) U.S. Cl.
CPC .......... *G06F 1/20* (2013.01); *F28D 15/02* (2013.01); *F28D 15/0275* (2013.01); *F28F 3/04* (2013.01); *F28F 13/00* (2013.01); *H01L 23/34* (2013.01); *H01L 23/367* (2013.01); *H01L 23/427* (2013.01); *H05K 7/20* (2013.01);
(Continued)

(58) Field of Classification Search
CPC ........ G06F 1/20; F28D 15/02; F28D 15/0275; F28D 2021/0029; F28F 13/00; F28F 3/04; F28F 2215/04
See application file for complete search history.

(56) References Cited

U.S. PATENT DOCUMENTS 4,748,538 A * 5/1988 Tsuji ................. H01L 23/367
                                                 165/185
6,062,302 A * 5/2000 Davis .................. F28D 15/02
                                                 165/104.21

(Continued)

FOREIGN PATENT DOCUMENTS

DE    10244805 A1 *  4/2004  .......... F28F 13/003
EP    2930587       10/2015
(Continued)

OTHER PUBLICATIONS

Bornoff, Robin, "Organically Grown 3D Printable Heatsinks—Part 1: A Simple Iterative Procedure", Published on: Mar. 24, 2015 Available at: http://blogs.mentor.com/robinbornoff/blog/2015/03/24/organically-grown-3d-printable-heatsinks-part-1-a-simple-iterative-procedure/.

(Continued)

*Primary Examiner* — Robert J Hoffberg
(74) *Attorney, Agent, or Firm* — Lempia Summerfield Katz LLC

(57) ABSTRACT

3D printed thermal management devices and corresponding methods of manufacturing are described herein. A thermal management device includes a single contiguous component including at least a portion of a first heat exchanger and at least a portion of a second heat exchanger. The second heat exchanger is of a different type than the first heat exchanger.

17 Claims, 10 Drawing Sheets

(51) Int. Cl.
*H05K 7/20* (2006.01)
*G06F 1/20* (2006.01)
*F28D 15/02* (2006.01)
*F28F 3/04* (2006.01)
*F28F 13/00* (2006.01)
*H01L 23/34* (2006.01)
*F28D 21/00* (2006.01)

(52) U.S. Cl.
CPC ....... *H05K 7/2039* (2013.01); *H05K 7/20154* (2013.01); *H05K 7/20336* (2013.01); *F28D 2021/0029* (2013.01); *F28F 2215/04* (2013.01); *F28F 2250/08* (2013.01)

(56) References Cited

U.S. PATENT DOCUMENTS

| | | | |
|---|---|---|---|
| 6,381,135 B1 | 4/2002 | Prasher et al. | |
| 6,898,082 B2* | 5/2005 | Dessiatoun | H01L 23/427 165/104.33 |
| 7,019,975 B2* | 3/2006 | Nagatomo | H01L 23/3735 257/703 |
| 7,201,215 B2 | 4/2007 | Ippoushi et al. | |
| 7,447,029 B2 | 11/2008 | Lai et al. | |
| 7,710,723 B2* | 5/2010 | Korich | H05K 7/20927 165/104.33 |
| 8,094,454 B2* | 1/2012 | Lowry | H01L 23/433 165/80.4 |
| 8,867,210 B2* | 10/2014 | Harmelink | H05K 7/20254 165/104.33 |
| 9,165,854 B2* | 10/2015 | Chun | H01L 23/3672 |
| 2004/0163798 A1* | 8/2004 | Ghosh | F28D 15/0233 165/104.21 |
| 2010/0107681 A1* | 5/2010 | Morimoto | F24F 1/0059 62/498 |
| 2010/0326628 A1* | 12/2010 | Campbell | F28D 15/02 165/104.21 |
| 2010/0326629 A1 | 12/2010 | Meyer, IV et al. | |
| 2012/0325437 A1 | 12/2012 | Meyer et al. | |
| 2013/0340978 A1* | 12/2013 | Agostini | H05K 7/20309 165/104.21 |
| 2014/0060783 A1* | 3/2014 | Ciulla | F04B 43/046 165/109.1 |
| 2015/0000886 A1* | 1/2015 | Lee | B23P 15/26 165/185 |
| 2015/0043226 A1* | 2/2015 | Horng | F21V 29/02 362/373 |
| 2015/0062820 A1* | 3/2015 | Lam | H01L 23/473 361/700 |
| 2015/0070955 A1* | 3/2015 | Tokuyama | H01L 23/36 363/131 |
| 2015/0109735 A1* | 4/2015 | Campbell | H05K 7/20318 361/700 |
| 2015/0230366 A1* | 8/2015 | Shedd | H05K 7/20818 165/84 |
| 2015/0237762 A1 | 8/2015 | Holt et al. | |
| 2016/0123637 A1* | 5/2016 | Moreno | F25B 39/02 62/516 |

FOREIGN PATENT DOCUMENTS

| | | |
|---|---|---|
| JP | 2014064035 | 4/2014 |
| WO | 2013153486 A1 | 10/2013 |
| WO | 2013163398 A1 | 10/2013 |
| WO | 2014173419 | 10/2014 |
| WO | 2014173419 A1 | 10/2014 |

OTHER PUBLICATIONS

Vogel, Marlin, "Thermal Design Center", Published on: Jun. 8, 2010 Available at: http://www.thermaldesigncenter.org/html/presentations.html.

Srinivasan, et al., "Design of a Mini Heat Sink Based on Constructal Theory for Electronic Chip Cooling", In Proceedings of 12th International Conference on Nanochannels, Microchannels and Minichannels, Aug. 3, 2014, 2 pages.

Stone, Erin, "Heat Sinks are an Ideal DMLS Application", Published on: Nov. 21, 2014 Available at: http://www.i3dmfg.com/heat-sinks-ideal-dmls-application/.

Hobson, James, "3D Printing Circuits Gets Rid of the Box Altogether", Published on: Jan. 6, 2015 Available at: http://hackaday.com/2015/01/06/3d-printing-circuits-gets-rid-of-the-box-altogether/.

"3D Printing", Retrieved on: Jul. 16, 2015 Available at: http://www.qats.com/Services/3D-Printing.

"International Search Report & Written Opinion Issued in PCT Application No. PCT/US2017/017083", dated May 19, 2017, 13 Pages.

* cited by examiner

3D PRINTED THERMAL MANAGEMENT SYSTEM

BRIEF DESCRIPTION OF THE DRAWINGS

For a more complete understanding of the disclosure, reference is made to the following detailed description and accompanying drawing figures, in which like reference numerals may be used to identify like elements in the figures.

Figure 1:
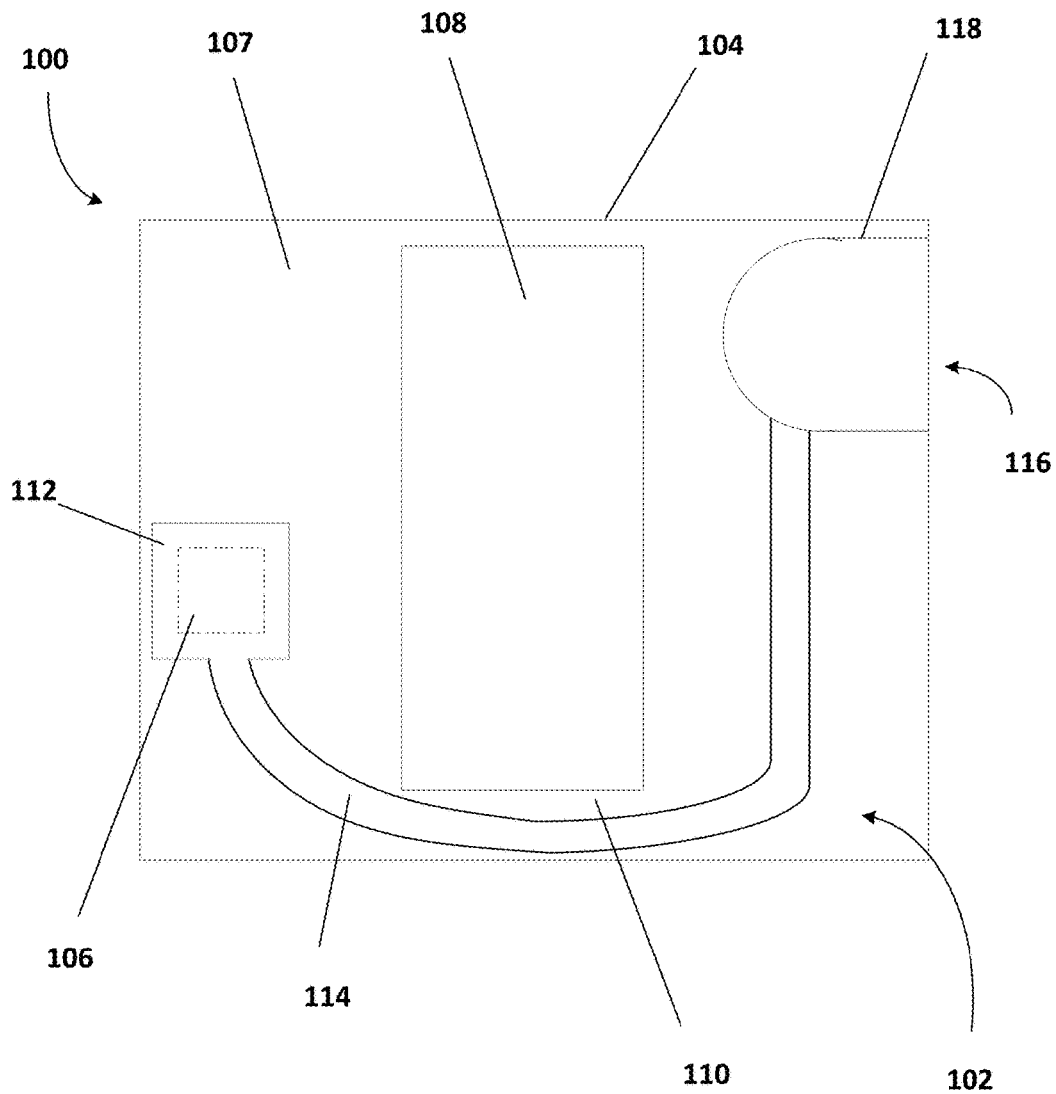
FIG. 1 depicts a top view of a computing device including a thermal management system.

While the disclosed devices, systems, and methods are representative of embodiments in various forms, specific embodiments are illustrated in the drawings (and are hereafter described), with the understanding that the disclosure is intended to be illustrative, and is not intended to limit the claim scope to the specific embodiments described and illustrated herein

DETAILED DESCRIPTION

Current microprocessor design trends include designs having an increase in power, a decrease in size, and an increase in speed. This results in higher power in a smaller, faster microprocessor. Another trend is towards lightweight and compact electronic devices. As microprocessors become lighter, smaller, and more powerful, the microprocessors also generate more heat in a smaller space, making thermal management a greater concern than before.

The purpose of thermal management is to maintain the temperature of a device within a moderate range. During operation, electronic devices dissipate power as heat that is to be removed from the device. Otherwise, the electronic device will get hotter and hotter until the electronic device fails, reducing service life of the electronic device. Short of failure, electronic devices run slowly and dissipate power poorly at high temperatures.

Current thermal management devices are manufactured with traditional manufacturing methods such as, for example, stamping, extrusion, casting, and machining. A thermal management apparatus or system may include a number of different types of thermal management devices such as for example, a heat pipe, a vapor chamber, a heat sink, a fan, or any combination thereof. As an example, a thermal management system may include a heat pipe and a heat sink. The heat pipe and the heat sink are manufactured as separate parts using traditional manufacturing methods, and the heat sink is attached to the heat pipe with, for example, a thermal interface material therebetween. The attachment of the heat sink to the heat pipe, for example, forms a joint that creates thermal resistance, thus reducing heat transfer capabilities from the heat pipe to the heat sink, and ultimately out of the device.

Disclosed herein are apparatuses, systems, and methods for improved heat dissipation from an electronic device. The improved heat dissipation within an electronic device may be provided by thermal management devices or systems manufactured with additive manufacturing (e.g., 3D printing). 3D printing a thermal management device allows for optimized and customizable thermal solutions. For example, tight bends and non-planar geometries that may not be possible with traditional manufacturing methods may be manufactured using 3D printing. Tight spaces within the electronic device, which are otherwise avoided for thermal management solutions of the prior art due to manufacturing tolerances, may be accessed, for example, via channels manufactured with 3D printing. Multiple thermal management devices making up a thermal management system may be printed as a single part, thus eliminating the use of a thermally inefficient bond to attach the multiple thermal management devices, reducing the weight of the thermal management system, reducing the overall size of the thermal management system (e.g., reducing the height of the thermal management system), and improving heat dissipation from the electronic device compared to the prior art. For example, a heat pipe or a vapor chamber may be formed with a heat sink as a single part with 3D printing. Fins of the heat sink may be of varied size and/or shape for optimized efficiency.

As an example, the improved heat dissipation within an electronic device may be implemented by providing a thermal management system including a single contiguous component. The single contiguous component includes at least a portion of a first heat exchanger and at least a portion of a second heat exchanger. The second heat exchanger is of a different type than the first heat exchanger. The single contiguous component may be manufactured using 3D printing.

Such heat dissipation apparatuses, systems, or methods have several potential end-uses or applications, including any electronic device having a passive or an active cooling component (e.g., fan). For example, the heat dissipation apparatus may be incorporated into personal computers, server computers, tablet or other handheld computing devices, laptop or mobile computers, communications devices such as mobile phones, multiprocessor systems, microprocessor-based systems, set top boxes, programmable consumer electronics, network PCs, minicomputers, mainframe computers, or audio or video media players. In certain examples, the heat dissipation apparatus may be incorporated within a wearable electronic device, where the device may be worn on or attached to a person's body or clothing. The wearable device may be attached to a person's shirt or jacket; worn on a person's wrist, ankle, waist, or head; or worn over their eyes or ears. Such wearable devices may include a watch, heart-rate monitor, activity tracker, or head-mounted display.

Using one or more of these features described in greater detail below, improved heat dissipation may be provided for the electronic device. With the improved heat dissipation feature, a more powerful microprocessor may be installed for the electronic device, a thinner electronic device may be designed, a higher processing speed may be provided, or a combination thereof may be provided when compared to a similar electronic device without one or more of the improved heat dissipation features. In other words, the heat dissipation features described herein may provide improved thermal management for an electronic device such as a mobile phone, tablet computer, or laptop computer.

FIG. 1 shows a top view of a computing device 100 including an example of a thermal management system 102. The computing device 100 may be any number of computing devices including, for example, a personal computer, a server computer, a tablet or other handheld computing device, a laptop or mobile computer, a communications device such as a mobile phone, a multiprocessor system, a microprocessor-based system, a set top box, a programmable consumer electronic device, a network PC, a mini-computer, a mainframe computer, or an audio and/or video media player. The thermal management system 102 is, for example, a 3D printed thermal management system that is manufactured as a single part.

The computing device 100 includes a housing 104 that supports at least the thermal management system 102 and a heat generating electrical device 106. The heat generating electrical device 106 may be any number of electrically powered devices including, for example, a processor, memory, a power supply, a graphics card, a hard drive, or other electrically powered devices. The heat generating electrical device 106 (e.g., a processor) may be supported by the housing 104 via, for example, a printed circuit board (PCB) 107 attached to and/or supported by the housing 104. The processor 106 is in communication with other electrical devices or components (at least a portion of which is represented by element 108) of the computing device 100 via the PCB 107, for example. The computing device 100 may include a number of components not shown in FIG. 1 (e.g., a hard drive, a power supply, connectors).

Due to, for example, space constraints within a device such as a tablet, components of the computing device 100 may be positioned in close proximity to one another. In the example shown in FIG. 1, the processor 106 may generate the largest portion of heat generated within the computing device 100, and thus, the left side (e.g., the hot side) of the computing device 100 may get hotter than the right side (e.g., the cold side) of the computing device 100 when the processor 106 is running above a particular percentage. As shown in the example of FIG. 1, components 108 (e.g., a power supply, a hard drive, memory) may physically separate the hot side and the cold side. Access from the hot side to the cold side for a thermal management system may allow for more effective heat transfer away from a heat generating device such as a processor. As illustrated by passage 110 formed between the components 108 and the housing 104, open spaces or regions (e.g., on the hot side and the cold side, respectively) may be separated by long, narrow channels. In thin or narrow channels that connect larger, open spaces, pure conduction may not be sufficient to transfer heat from one region to another. Phase change devices such as, for example, heat pipes and vapor chambers may more effectively transfer heat between the hot side and the cold side. The highest thermal efficiency for a computing device occurs when the computing device is completely isothermal.

Prior art manufacturing processes for thermal management devices include stamping, extrusion, casting, and machining. Such manufacturing processes, however, are constrained based on the material being used and the device being manufactured. As an example, vapor chambers of the prior art may use sheet metal having features that serve as a fluid path etched or sintered into one side. Two plates with mirrored features are bonded together to form a vapor space. The use of sheet metal in the vapor chamber limits the features that may be made out of plane, as risk of performance degradation exists when out-of-plane features are added to the device. For a heat pipe, the design is limited to allowable radii of curvature, as a prior art heat pipe may be constructed of bent tubes that are then flattened. If the radius of curvature is too tight, then the material may yield, crack, or deform. Thermal management devices manufactured with these prior art processes are also constrained by associated tolerances.

With the manufacturing processes of the prior art, the passage 110 may thus have been considered wasted space. Tolerances for 3D printed thermal management devices are smaller compared to the prior art manufacturing processes. Also, 3D printing does not have the constraints discussed above. The 3D printed thermal management system 102 may thus be contoured to take better advantage of the previously wasted space and thermally connect the hot side to the cold side. In other words, thermal management devices or systems may be manufactured with 3D printing to occupy 3D spaces not accessible by thermal management devices manufactured with prior art processes (e.g., due to tight bends and corners, transitions from one plane to another plane).

The thermal management system 102 shown in FIG. 1 includes at least a heat spreader 112 and a phase change device 114 (e.g., a heat pipe or a vapor chamber). The heat spreader 112 is positioned on or adjacent to the processor 106. The heat spreader 112 is the same shape as the processor 106 but is larger than the processor 106. In other examples, the heat spreader 112 is a different size and/or shape, or the heat spreader 112 is part of the phase change device 114. In one example, at least one layer of material such as, for example, a thermal compound is disposed between the processor 106 and the heat spreader 112. The phase change device 114 extends away from the heat spreader 112 on the hot side, around the components 108, and towards the cold side. The thermal management system 102 is attached to the housing 104 in any number of ways including, for example, using one or more connectors (e.g., screws, flanges, tabs).

In the example shown in FIG. 1, the thermal management system 102 is a contiguous 3D printed part. The contiguous 3D printed part 102 is made of any number of materials including, for example, copper, aluminum, titanium, gold, or another thermally conducting material. In one example, the contiguous 3D printed part 102 is made of a single material (e.g., copper). In another example, the contiguous 3D printed part 102 is made of more than one material (e.g., copper and aluminum).

The internal structure of a heat pipe or vapor chamber is important for phase change performance. Features that affect phase change performance include vapor space and capillary features. The vapor space is a path for evaporated working fluid to travel to a condenser, and the capillary features are a pathway for condensed working fluid to return to an evaporator. The internal vapor space may be shaped to take advantage of voids in the overall system, which improves the overall performance of the heat pipe or the vapor chamber and improves power capabilities. The capillary features may be printed directly on internal surfaces of the phase change device 114 and may be optimized for performance. Since the capillary features are part of the contiguous 3D printed part, the capillary features are not subject to failure mechanisms, such as, for example, collapse, cracking, or wrinkling, that sintering and mesh structure processes for forming a phase change device of the prior art are subject to.

In thin, more planar regions of the computing device 100, the phase change device 114 may take the form of a vapor chamber. In narrower but thicker regions of the computing device 100, the phase change device 114 may take the form of a traditional heat pipe. As long as the cross-sectional area is maintained, then phase change performance is also maintained. The thermal performance is enhanced because of the continuity of the vapor space.

The thermal management system 102 may include more and/or different components. In one example, the thermal management system 102 also includes a plurality of fins extending away from the heat spreader 112 and/or the phase change device 114 (see FIG. 2). In another example, the thermal management system 102 also includes at least a portion of a fan 116. In the example shown in FIG. 1, the portion of the fan 116 is a fan housing 118. The heat spreader 112, the phase change device 114, and the fan housing 118 may be 3D printed as a single contiguous part in such an example.

Heat sinks of the prior art may be attached to phase change devices to provide an extended surface area for heat rejection out of a computing device. In the prior art, a heat sink may be physically attached (e.g., soldered) to an outer surface of a heat pipe or vapor chamber. The attachment region creates an additional thermal resistance in the thermal management system, thus reducing overall performance of the thermal management system. Fin geometries for fins manufactured using processes of the prior art are also limited to basic shapes.

Figure 2:
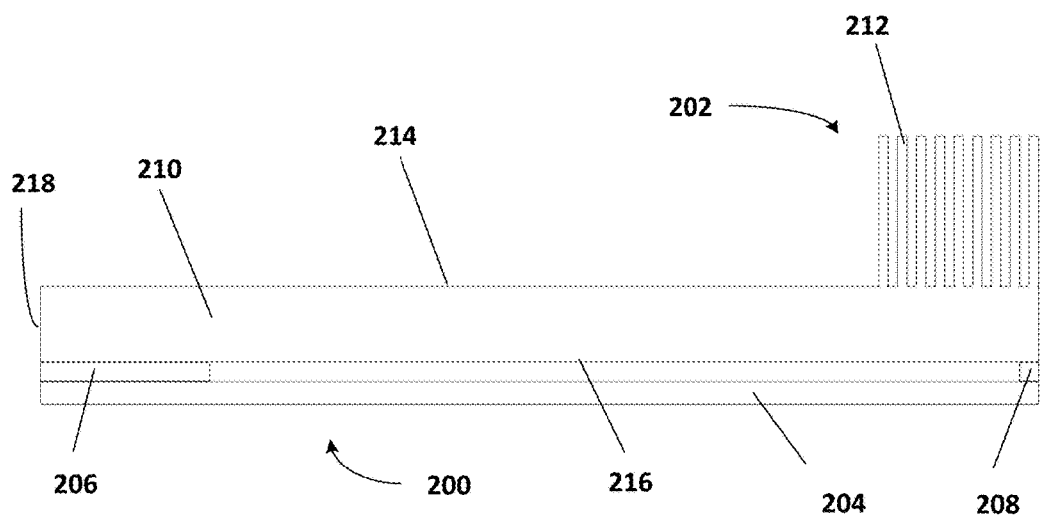
FIG. 2 depicts a front view of a portion of a computing device including an example of a thermal management system.

FIG. 2 shows a front view of a portion of a computing device 200 including an example of a thermal management system 202. The computing device 200 houses a PCB 204 that supports a heat generating electrical device 206 (e.g., a processor). A portion of the thermal management system 202 is thermally connected to, physically attached to, and/or abuts the processor 206. The thermal management system 202 is connected to the PCB 204, a housing (not shown), or another surface of the computing device 200 via one or more connectors 208, for example. The computing device 200 may include more and/or different components.

The thermal management system 202 includes a phase change device 210 (e.g., a heat pipe or a vapor chamber) and a plurality of extended surfaces 212 (e.g., fins). The phase change device 210 includes a top 214, a bottom 216, and at least one side 218. In the example shown in FIG. 2, the plurality of fins 212 extend away from the top 214 of the phase change device 210 in a direction perpendicular to the top 214 of the phase change device 210. The example of FIG. 2 shows nine rectangular fins 212 extending away from the top 214 of the phase change device 210. Depending on the computing device 200 and the application of the thermal management system 202 within the computing device 200 (e.g., the device to be cooled, where fans are located within the computing device), the thermal management system 202 may include more or fewer fins 212, the fins 212 may extend away from additional and/or other surfaces (e.g., the bottom 216 of the phase change device 210), at least some of the fins 212 may extend away from the phase change device 210 in different directions, at least some of the fins 212 may be shaped differently (see FIG. 3), or any combination thereof. In one example, a fin extends at least partially around the phase change device 210. Other configurations of the fins may be provided.

In the example of FIG. 2, the fins 212 are 3D printed directly on the phase change device 210. The 3D printed fins 212 are thus contiguous with the phase change device 210, and the thermal management system 202 is formed as a single part. 3D printing the fins 212 directly on the phase change device 210 removes thermal losses that exist with prior art processes of joining components of a thermal management system such as, for example, a heat pipe and a heat sink. For example, in the prior art, parts such as radiator fins are each separate, and the radiator fins are brazed or otherwise attached on the heat pipe or another surface. The bonds between each of the radiator fins and the heat pipe, for example, increase the thermal resistance within the prior art device, thus decreasing the thermal efficiency.

3D printing fins directly on a phase change device or another surface (e.g., a heat spreader) also allows the fins to be largely varied depending on the system geometry and the cooling method. For example, if active cooling is used, the fins may be designed for optimal active cooling efficiency in high flow regions of a computing device, then tuned to be optimal for dissipation through natural convection in low flow regions of the computing device. The natural convection fins may be configured to perform optimally at a standard orientation of the computing device. Also, the fins may take on any number of shapes so that the fins conform to various components of the computing device. For example, if the primary heat spreading portion of a thermal management system is a planar surface that runs parallel to a surface of a motherboard, the fins may be added to the top and the bottom of the primary heat spreading portion. In a region between the motherboard and the primary heat spreading portion, the fins may vary in geometry to take up spaces not occupied by components on the motherboard.

Fins that are not directly in front of a blower (e.g., a fan) are cooled by air traveling through the housing of the computing device (e.g., a device chassis) from air inlets around the computing device to the blowers. In effect, the fins are "pre-heating" this cool air before the air goes into the blower. This is helpful because the fins at the exhaust of the blower are limited in size due to system constraints, and the ability of the fins to reject heat is thus limited. There may be spare heat capacity remaining in the air after the air has passed through the system and the fins. By adding fins inside the system, all of the heat capacity of the air may be utilized.

Figure 3:
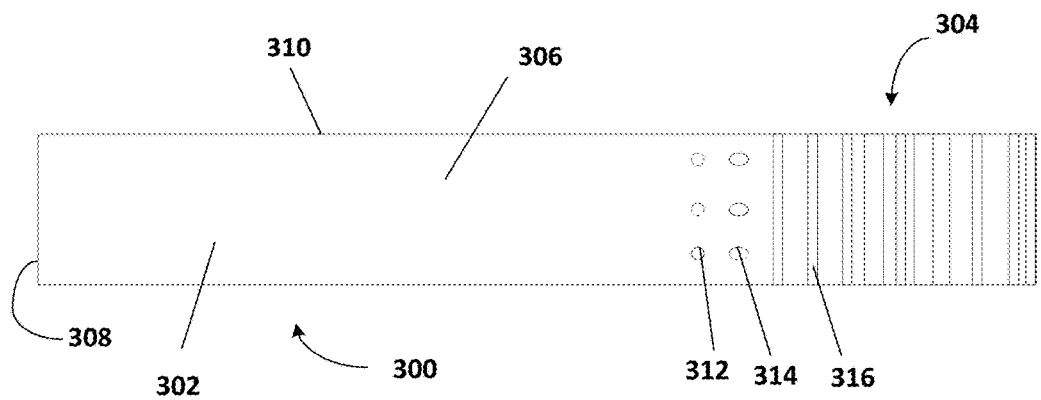
FIG. 3 depicts a top view of an example of a thermal management system including fins of different geometry.

FIG. 3 shows a top view of an example of a thermal management system 300 including fins of different geometry. The thermal management system 300 includes a phase change device 302 and a plurality of fins 304. The phase change device 302 includes a top 306, a bottom 308, and at least one side 310. The plurality of fins 304 extend away from at least the top 306 of the phase change device 302.

The plurality of fins 304 include first fins 312, second fins 314, and third fins 316. The first fins 312, the second fins 314, and the third fins 316 are shaped differently. In the example shown in FIG. 3, the first fins 312 are cylindrical, the second fins 314 have an elliptical cross section, and the third fins 316 have a rectangular cross section. In other examples, the plurality of fins 304 include more, fewer, more types, fewer types, and/or different types of fins. For example, the fins may be any number of shapes including, for example, fins with a circular cross section that varies with distance from the base of the fin (e.g., the surface from which the fin extends). As another example, the plurality of fins 304 include channels or tubes with different cross-sectional shapes such as, for example, hexagons, and/or channels or tubes with walls defined by different shapes including, for example, sine waves or Bezier curves.

The plurality of fins 304 may be any number of sizes and may be positioned in any number of ways to, for example, control air flow through the fins 304. For example, the third fins 316 vary in thickness and are positioned on the top 306 of the phase change device 302 in a non-uniform way.

Figure 4:
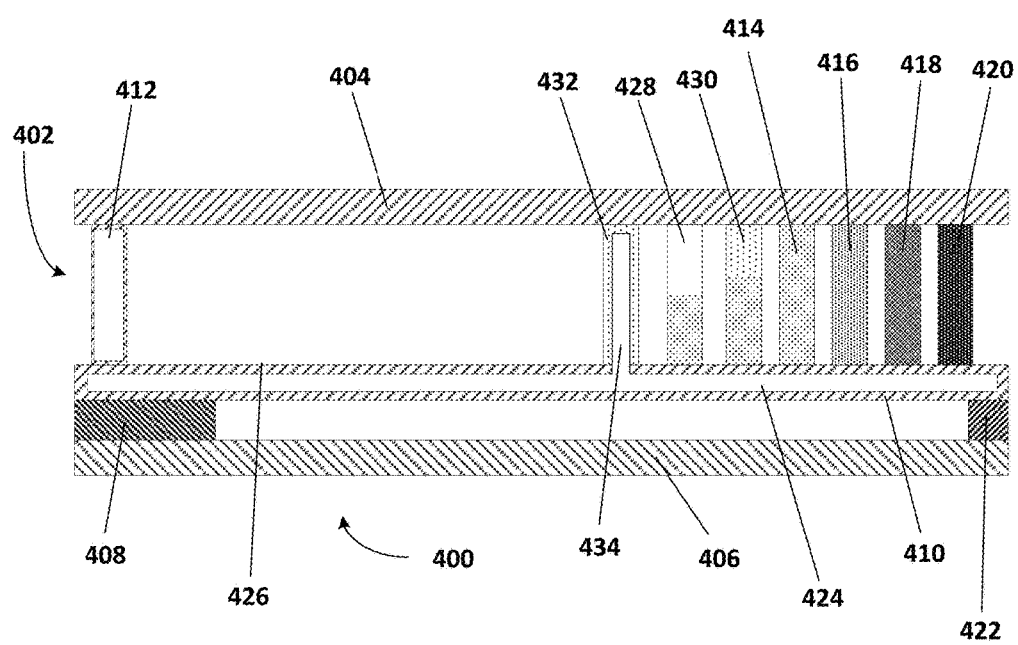
FIG. 4 depicts a cross section of a portion of a computing device including an example of a thermal management system.

As shown in FIG. 4, subsets of fins may also have different densities. FIG. 4 shows a cross section of a portion of a computing device 400 including an example of a thermal management system 402. The computing device 400 includes a housing 404 that supports a PCB 406 on which a heat generating electrical device 408 (e.g., a processor) is positioned. The thermal management system 402 is a 3D printed single contiguous part that includes a phase change device 410 (e.g., a heat pipe) and a plurality of fins 412, 414, 416, 418, 420. The phase change device 410 is connected to the PCB 406 with one or more connectors 422. The one or more connectors 422 may be insulators and/or may be 3D printed as part of the thermal management system 402 as hollow connectors to limit heat transfer from the phase change device 410 to the PCB 406. In one example, the one or more connectors 422 may be 3D printed as highly porous or low density structures directly onto the thermal management system 402. The one or more connectors 422 may thus be poor thermal paths but strong mechanical paths, allowing an overall improvement in stiffness for the computing device 400.

A portion of the phase change device 410 abuts the processor 408. In one example, one or more layers of a thermally conductive material (e.g., a layer of thermal paste) are disposed between the processor 408 and the phase change device 410. The phase change device 410 may be any number of shapes and/or sizes including, for example, tubular or flat.

The phase change device 410 includes a vapor space 424 that is partially filled with a working fluid (not shown). The working fluid may be any number of working fluids including, for example, ammonia, alcohol, ethanol, or water. The vapor space 424 is a path for evaporated working fluid to travel to a cold interface (e.g., a condenser) of the phase change device 410. Capillary features may be 3D printed directly onto the phase change device. As examples, the 3D printed capillary features may include screen wick structures, open channels, channels covered with screens, an annulus behind a screen, an artery structure, a corrugated screen, other structures, or any combination thereof. The vapor space 424 may be shaped to take advantage of voids in the computing device 400, for example, which improves performance of the phase change device 410 and power capabilities compared to the prior art.

The plurality of fins 412, 414, 416, 418, 420 extend away from at least an external surface 426 of the phase change device 410. In the prior art, a thermal module (e.g., the thermal management system) is generally isolated from the housing or chassis of the system (e.g., the computing device) to eliminate thermal shorting and excessive hot spots. As illustrated by the example of FIG. 4, however, 3D printed fins may be configured with variable densities such that heat transfer from the processor 408 to the housing 404 is controllable. 3D printed fins may thus be positioned in a region adjacent to the housing 404 (e.g., between the phase change device 410 and the housing 404).

In regions closer to a heat generating component (e.g., the processor 408), fins and/or support structures may have a low density/high porosity. Conduction and radiation will make the regions closer to the processor 408, for example, hotter. Further away from the processor 408, the fins may be denser, such that heat transfer to the housing 404, for example, is increased. Mapping of fin density to hot spot may provide a uniform temperature distribution along an outer surface of the housing 404, for example, thus providing more optimal heat transfer.

In the example shown in FIG. 4, the fins 414, 416, 418, and 420 increase in density with distance away from the processor 408. The fin 412 directly above the processor 408 is hollow. Alternatively, the fin 412 is not hollow but has the lowest density of the fins 412, 414, 416, 418, and 420. The fin 412 minimizes heat transfer from the phase change device 410 to the housing 404, through the fin 412, while also providing mechanical support.

In another example, at least one fin has a variable density along the fin. Fins 428 and 430 of FIG. 4 illustrate such variable densities. For example, the density of the fin 428 decreases along the fin 428 in a direction away from the phase change device 410, and the density of the fin 430 decreases along the fin 430 in a direction away from the phase change device 410. Since the fin 428 is closer to the processor 408 than the fin 430, an average density or a minimum density within the fin 428 is less than an average density or a minimum density within the fin 430.

In yet another example, at least one fin includes a vapor path connected with a vapor space of a phase change device. All fins of a plurality of fins of a heat sink may include a vapor path connected to the phase change device to provide nearly isothermal fins. As an example, fin 432 of FIG. 4 includes a vapor path 434 connected to the phase change device 410.

Figure 5:
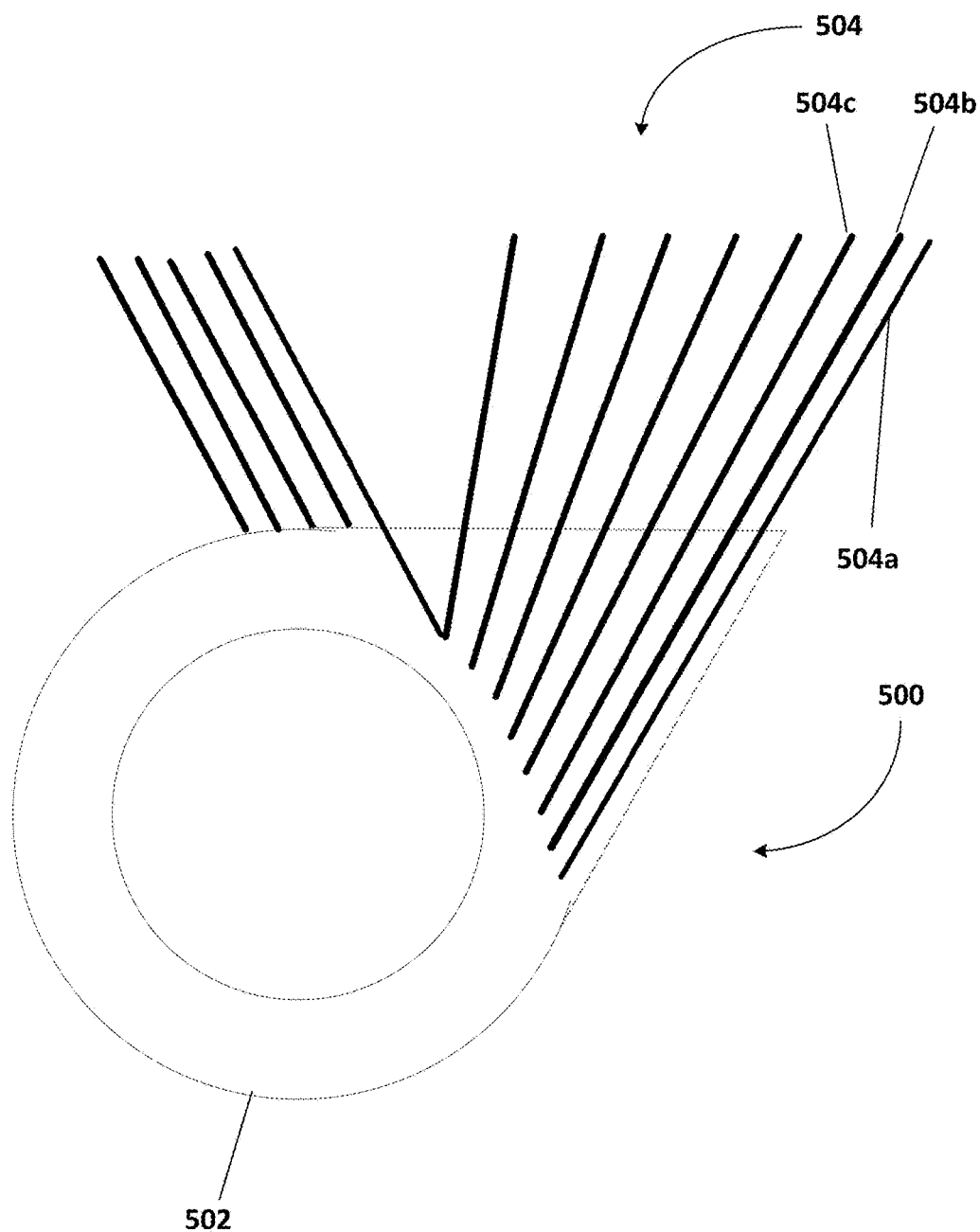
FIG. 5 depicts a top view of an example of a thermal management system.

Other thermal management devices may be 3D printed together as a single part thermal management system. As an example, FIG. 5 shows a top view of a thermal management system 500. The thermal management system 500 includes a fan housing 502 and a plurality of fins 504. The plurality of fins 504 extend in a direction away from the fan housing 502. The fan housing 502 and the plurality of fins 504 are encapsulated into a single part such that an optimal thermal solution in terms of weight, volume, noise, and heat transfer capacity is provided. Incorporating the plurality of fins 504 in the fan housing 502 as a single 3D printed part allows for optimal control of the flow field. Recirculation is eliminated when undesirable, and flow leaking may be added where beneficial (e.g., between a heat exchanger and external surfaces).

As shown in the example of FIG. 5, the plurality of fins 504 extend into the fan housing 502. In another example, only a subset of the fins 504 extend into the fan housing 502. The fins 504 extending into the fan housing 502 allows the flow field to be better controlled, and a more uniform flow through all of the fins 504 is established. As also shown in the example of FIG. 5, the positions of the fins 504 are varied (e.g., relative to a fan impeller (see FIG. 6) and/or relative to each other). For example, the fin 504a and 504b are at an angle relative to each other (i.e., not parallel), and the distance between fins 504a and 504b is different than (e.g., less than) the distance between the fins 504b and 504c. The varied position of the fins 504 may reduce noise and promote uniform flow. As shown in the example of FIG. 5, fin thickness may vary relative to a heat source. For example, fin 504b has a greater thickness than fin 504a. In other examples, every fin of a plurality of fins has a different fin thickness, or a first subset of fins has a different thickness than a second subset of fins. The fin thickness may vary relative to the heat source so as to create isothermal fins.

Figure 6:
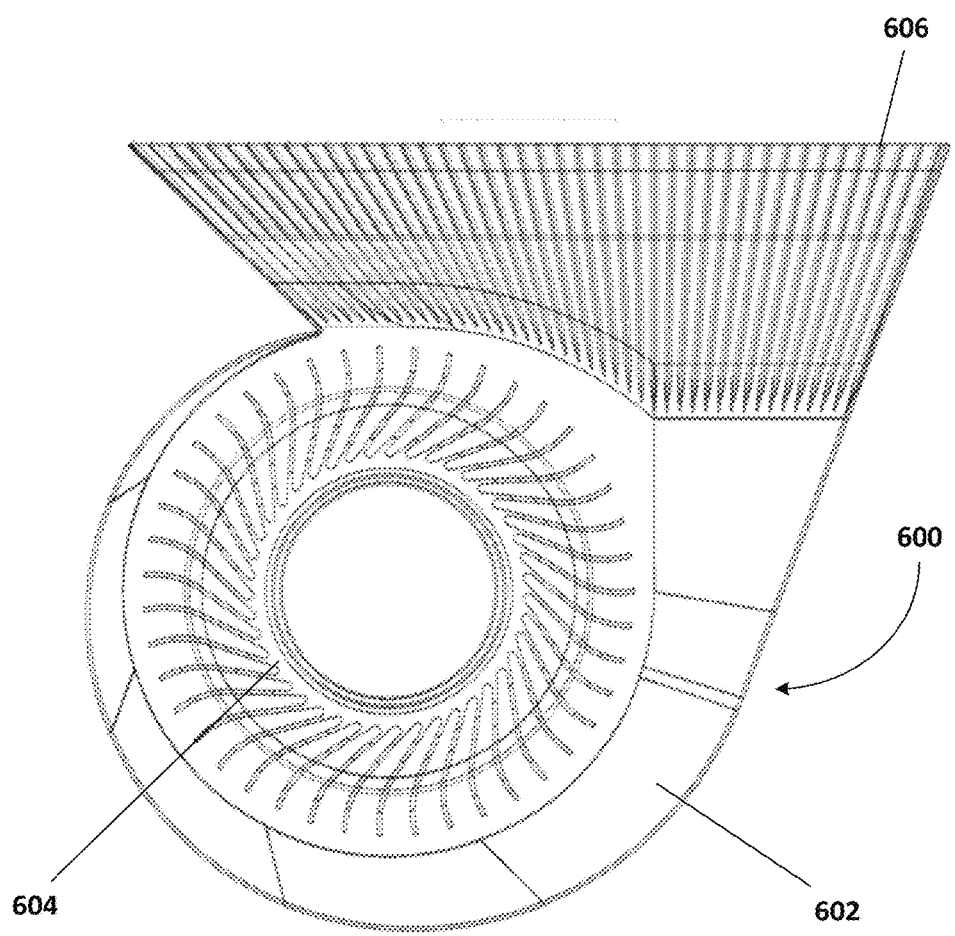
FIG. 6 depicts a top view of another example of a thermal management system.

FIG. 6 shows a top view of another thermal management system 600. The thermal management system 600 is similar to the thermal management system 500 of FIG. 5. The thermal management system 600 includes a fan housing 602 that houses an impeller 604, and a plurality of fins 606. The fan housing 602 and the plurality of fins 606 are 3D printed as a single contiguous part such that an optimal thermal solution in terms of weight, volume, noise, and heat transfer capacity is provided. The impeller 604 is separate from the 3D printed contiguous part including the fan housing 602 and the plurality of fins 606 but may also be a 3D printed part.

The plurality of fins 606 are positioned entirely within the housing 602 and extend in a direction away from the impeller 604. The angles of the plurality of fins 606 relative to each other vary across the plurality of fins 604. Each fin of the plurality of fins 606 extends across the entire height of the housing 602. The height of the housing 602 may vary (e.g., increase) with distance from the impeller 604.

Figure 7:
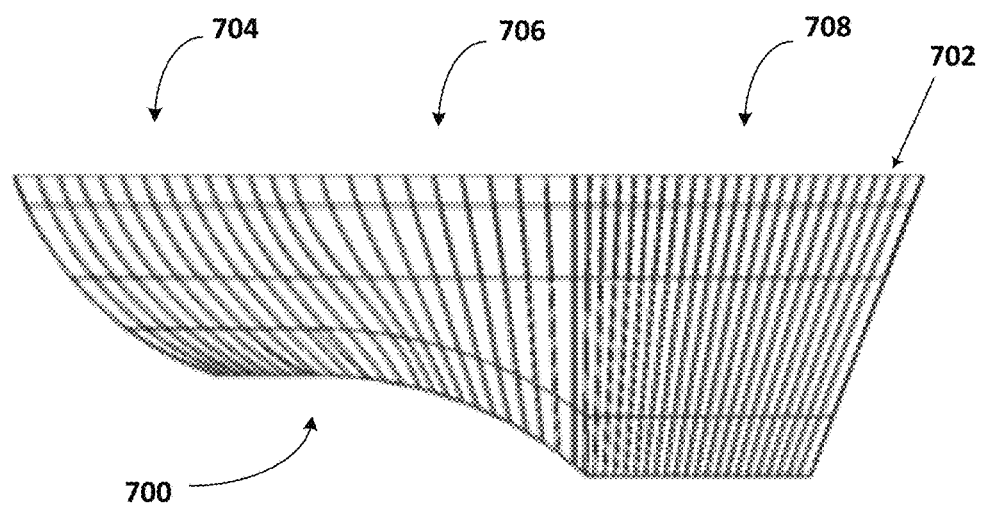
FIG. 7 depicts a top view of a 3D printed heat sink that includes a plurality of fins.

Other variances within a plurality of 3D printed fins may be provided. For example, FIG. 7 shows a top view (with a top removed) of a 3D printed heat sink 700 that includes a plurality of fins 702. In one example, the heat sink 700 is part of a 3D printed thermal management system including at least part of another thermal management device (e.g., a housing of a fan). The plurality of fins 702 include a variable density of fins. The plurality of fins 702 include a first subset of fins 704, a second subset of fins 706, and a third subset of fins 708. Fins 702 of the third subset of fins 708 are positioned the closest to each other (e.g., have the highest density), and fins 702 of the second subset of fins 706 are positioned the furthest from each other (e.g., have the lowest density). Fins 702 of at least the first subset of fins 704 are curved. In one example, at least some of the fins 702 are drafted fins. In other words, the cross section of each of the drafted fins 702 is wider at the bottom than at the top of the fin 702. Other fin cross sections may be provided. For example, the cross section of at least some of the fins 702 may be hour-glass shaped, of an airfoil design, or wing-shaped with variable cross-sections. In one example, the plurality of fins 702 are disposed entirely within a housing (e.g., including two open sides through which air flows) and extend from a bottom to a top of the housing.

Figure 8:
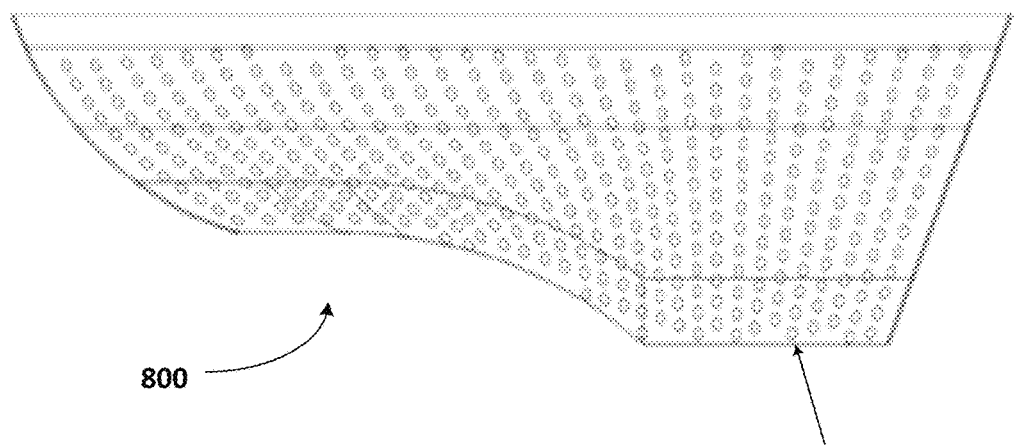
FIG. 8 depicts a top view of another example of a 3D printed heat sink that includes a plurality of fins.

FIG. 8 shows a top view (with a top removed) of another example of a 3D printed heat sink 800 that includes a plurality of fins 802. In one example, the heat sink 800 is part of a 3D printed thermal management system including at least part of another thermal management device (e.g., a housing of a fan). Each fin of the plurality of fins 802 is an elliptical pin fin or a circular pin fin. The plurality of fins 802 may be positioned within the heat sink 800 to optimize airflow through the heat sink 800. In one example, the plurality of fins 802 are disposed entirely within a housing (e.g., including two open sides through which air flows) and extend from a bottom to a top of the housing. In another example, the pin fins 802 are combined with another type of fins (e.g., fins 702) within a single 3D printed heat sink.

The number, position, size, and/or shape of the fins may be set to provide optimized heat transfer. The heat transfer may be maximized in a number of ways. For example, surface features may be added to increase surface area and/or roughness. The fin pitch may be varied in areas of high flow rate and low flow rate, respectively. Fin angle may be varied relative to flow field, and fin shape may be varied to promote flow in particular directions. A fan housing thickness may be varied relative to the heat source, and the fan housing density may be varied relative to the heat source. Creative shapes that may not be produced with methods of the prior art may be provided. Precise holes may be added to the housing and/or the fin pack to create Venturi inlets. Features of extended surfaces (e.g., fins) may be shaped to match the airflow contours inside of the computing device so that pressure loss is minimized and airflow is maximized.

Figure 9:
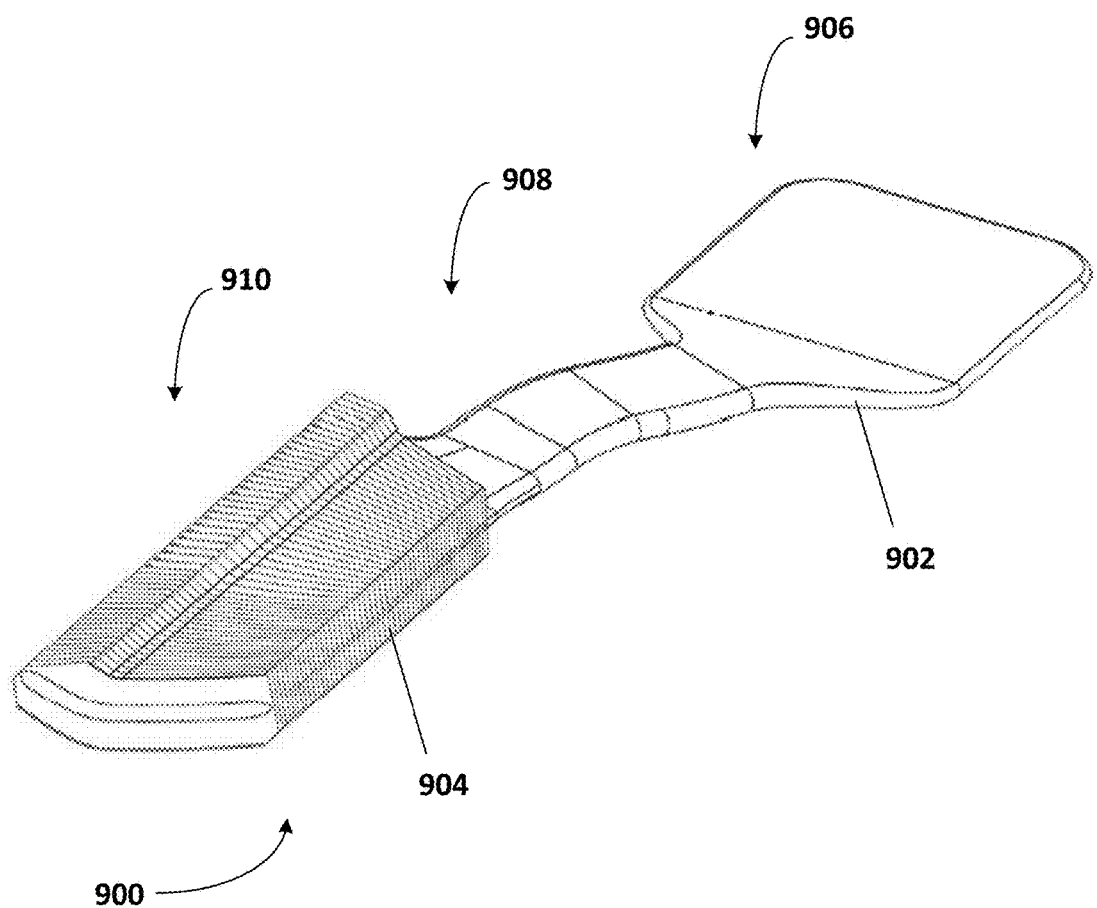
FIG. 9 shows an isometric view of an example of a thermal management system.

In one example, heat transfer may be increased by minimizing a conduction path through fins to a heat pipe. FIG. 9 shows an isometric view of an example of a thermal management system 900. The thermal management system 900 includes a heat pipe 902 and a plurality of fins 904. The heat pipe 902 and the plurality of fins 904 are 3D printed as a single contiguous part.

The heat pipe 902 includes a first portion 906, a second portion 908, and a third portion 910. The first portion 906 of the heat pipe 902 may be shaped and sized to cover and be positioned on or adjacent to a heat generating electrical device such as, for example, a processor (e.g., heat generating electrical device 106). The first portion 906 of the heat pipe 902 may be thinner but have a greater width than the second portion 908 and/or the third portion 910 of the heat pipe 902. The first portion 906 of the heat pipe 902 is located at a first height within a housing (e.g., housing 104) of an electronic device (e.g., computing device 100).

The third portion 910 of the heat pipe 902 extends through the plurality of fins 904. In the example shown in FIG. 9, the third portion 910 of the heat pipe 902 extends through a centerline of each fin of the plurality of fins 904. In other examples, the third portion 910 of the heat pipe 902 may extend through different parts of the plurality of fins 904 (e.g., closer the top or the bottom of the fins). The heat pipe 902 extending through the plurality of fins 904 shortens conduction paths from the heat pipe 902 to far edges of the plurality of fins 904, thus increasing heat transfer to the surroundings. The third portion 910 of the heat pipe 902 is located at a second height (e.g., a greater height relative to the bottom of the housing) within the housing of the electronic device. Other configurations may be provided.

The second portion 908 of the heat pipe 902 connects the first portion 906 and the third portion 910 of the heat pipe 902. The second portion 908 of the heat pipe 902 extends the heat pipe 902 from the first height to the second height within the housing of the electronic device. In one example, the thermal management system 900 does not include the second portion 908. The second portion 908 of the heat pipe 902 may be shaped and sized to contour the heat pipe to minimize disruption of and/or complement airflow. The first section 906, the second section 908, and the third section 910 of the heat pipe 902 may be sized and/or shaped such that a cross-sectional area of the vapor chamber of the heat pipe 902 remains constant along the length of the vapor chamber or heat pipe 902. Any number of other shapes and/or sizes may be provided for the first portion 906, the second portion 908, and/or the third portion 910 of the heat pipe 902.

The plurality of fins 904 may include any number of fins and may be any number of shapes and/or sizes and may have any number of positions relative to each other (e.g., angles) along the heat pipe 902. The shape of the plurality of fins 904 shown in FIG. 9 may complement airflow through the electronic device and/or help direct airflow towards a cool region within the electronic device.

Figure 10:
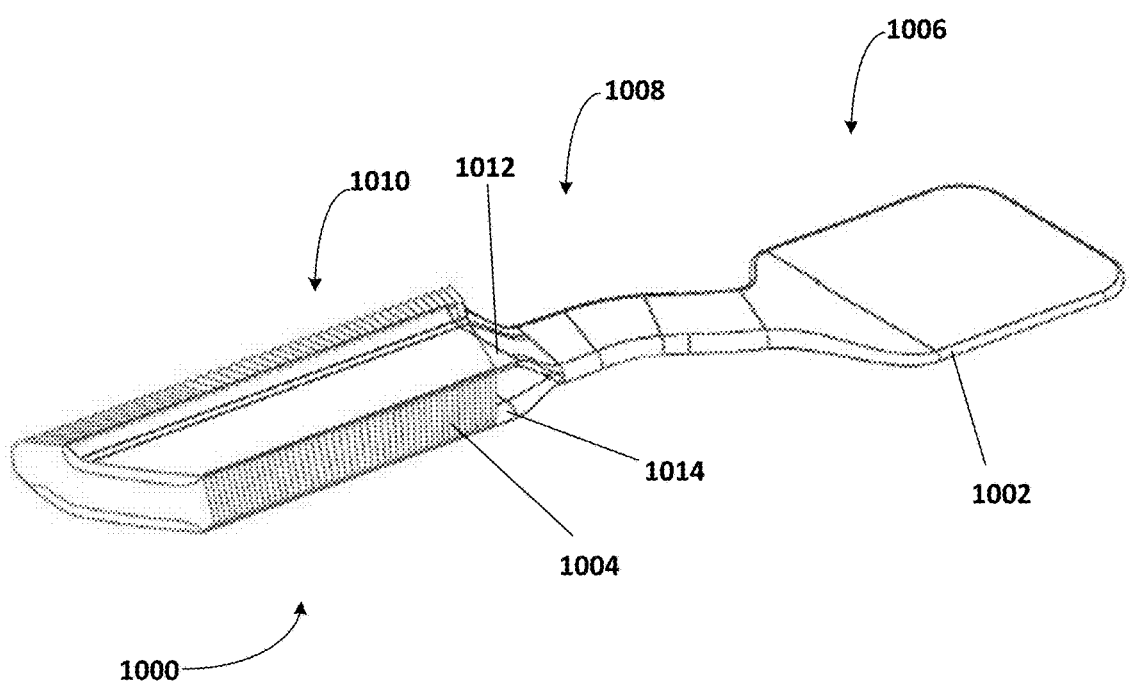
FIG. 10 shows an isometric view of another example of a thermal management system.

FIG. 10 shows an isometric view of another example of a thermal management system 1000. The thermal management system 1000 is similar to the thermal management system 900 of FIG. 9. The thermal management system 1000 includes a heat pipe 1002 and a plurality of fins 1004. The heat pipe 1002 and the plurality of fins 1004 are 3D printed as a single contiguous part.

Like the thermal management system 900 of FIG. 9, the thermal management system 1000 includes a first portion 1006, a second portion 1008, and a third portion 1010. Unlike the thermal management system 900 of FIG. 9, however, the heat pipe 1002 splits into two parts in the third portion 1010. In the example shown in FIG. 10, the heat pipe 1002 splits into a top part 1012 and a bottom part 1014. In other examples, the heat pipe 1002 may split into more than two parts (e.g., eight parts all at different heights; eight parts, four separate top parts and four separate bottom parts).

The plurality of fins 1004 extend from the top part 1012 of the heat pipe 1002 to the bottom part 1014 of the heat pipe 1002. In other examples, subsets of fins extend between different parts of the heat pipe 1002. For example, a first subset of fins extend between a first part of the heat pipe (e.g., at a first height relative to a part of the electronic device) and a second part of the heat pipe (e.g., at a second height relative to the part of the electronic device), and a second subset of fins extend between the second part of the heat pipe and a third part of the heat pipe (e.g., at a third height relative to the part of the electronic device).

Figure 11:
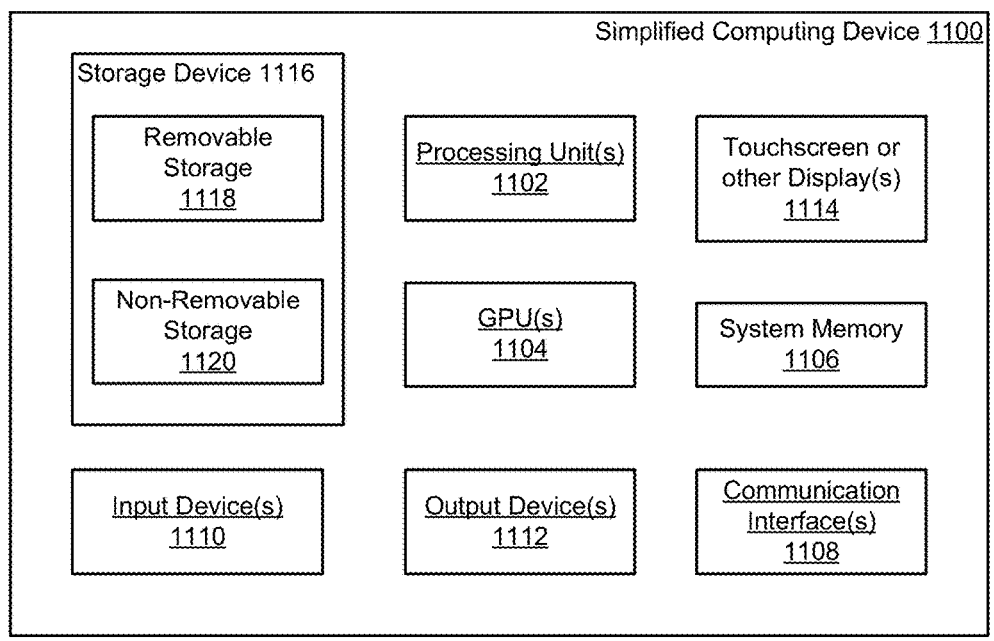
FIG. 11 is a block diagram of a computing environment in accordance with one example for implementation of the disclosed methods or one or more electronic devices.

With reference to FIG. 11, a thermal management system, as described above, may be incorporated within an exemplary computing environment 1100. The computing environment 1100 may correspond with one of a wide variety of computing devices, including, but not limited to, personal computers (PCs), server computers, tablet and other handheld computing devices, laptop or mobile computers, communications devices such as mobile phones, multiprocessor systems, microprocessor-based systems, set top boxes, programmable consumer electronics, network PCs, minicomputers, mainframe computers, or audio or video media players. For example, the heat dissipating apparatus is incorporated within a computing environment having an active cooling source (e.g., fan).

The computing environment 1100 has sufficient computational capability and system memory to enable basic computational operations. In this example, the computing environment 1100 includes one or more processing units 1102, which may be individually or collectively referred to herein as a processor. The computing environment 1100 may also include one or more graphics processing units (GPUs) 1104. The processor 1102 and/or the GPU 1104 may include integrated memory and/or be in communication with system memory 1106. The processor 1102 and/or the GPU 1104 may be a specialized microprocessor, such as a digital signal processor (DSP), a very long instruction word (VLIW) processor, or other microcontroller, or may be a general purpose central processing unit (CPU) having one or more processing cores. The processor 1102, the GPU 1104, the system memory 1106, and/or any other components of the computing environment 1100 may be packaged or otherwise integrated as a system on a chip (SoC), application-specific integrated circuit (ASIC), or other integrated circuit or system.

The computing environment 1100 may also include other components, such as, for example, a communications interface 1108. One or more computer input devices 1110 (e.g., pointing devices, keyboards, audio input devices, video input devices, haptic input devices, or devices for receiving wired or wireless data transmissions) may be provided. The input devices 1110 may include one or more touch-sensitive surfaces, such as track pads. Various output devices 1112, including touchscreen or touch-sensitive display(s) 1114, may also be provided. The output devices 1112 may include a variety of different audio output devices, video output devices, and/or devices for transmitting wired or wireless data transmissions.

The computing environment 1100 may also include a variety of computer readable media for storage of information such as computer-readable or computer-executable instructions, data structures, program modules, or other data. Computer readable media may be any available media accessible via storage devices 1116 and includes both volatile and nonvolatile media, whether in removable storage 1118 and/or non-removable storage 1120. Computer readable media may include computer storage media and communication media. Computer storage media may include both volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium that may be used to store the desired information and may be accessed by the processing units of the computing environment 1100.

Figure 12:
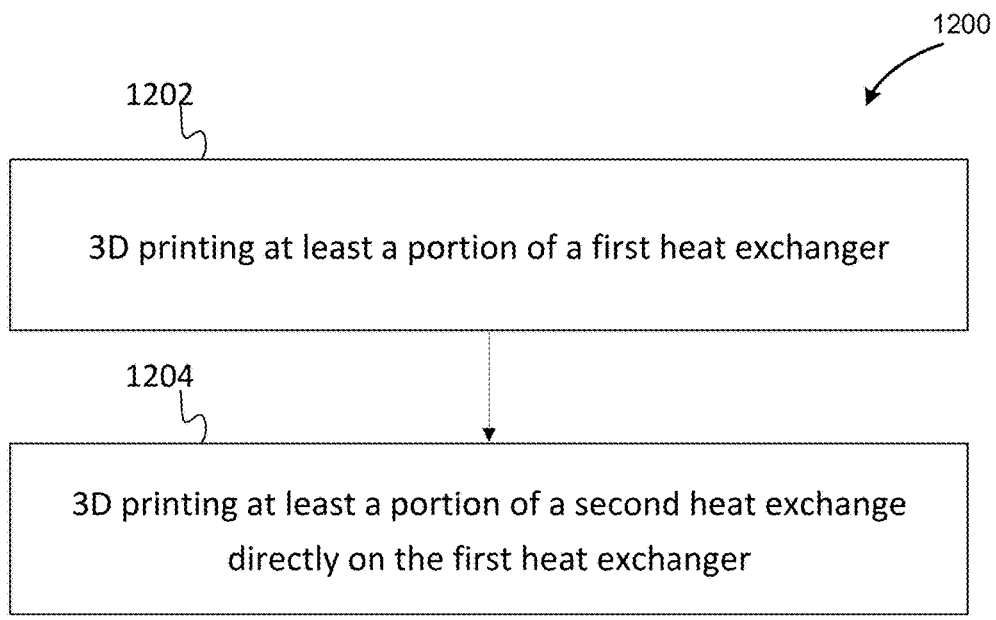
FIG. 12 is a flow diagram of a method of manufacturing a thermal management device in accordance with one example.

FIG. 12 shows a flowchart of one example of a method 1200 for manufacturing a thermal management device. The method 1200 is implemented in the order shown, but other orders may be used. Additional, different, or fewer acts may be provided. Similar methods may be used for manufacturing a thermal management device.

In act 1202, at least a portion of a first heat exchanger is produced using additive manufacturing (e.g., 3D printing). The 3D printing may include depositing layers of material onto a power bed with inkjet printer heads. Alternatively or additionally, the 3D printing may include an extrusion-based process, a sintering-based process, or another process. In an extrusion-based process, small beads of material are extruded, and the small beads of material harden to form the layers. In a sintering-based process, heat and/or pressure is used to compact and/or form the layers (e.g., with a laser). The successive layers of material may be deposited under computer control based on a 3D model to produce an object (e.g., the first heat exchanger).

The first heat exchanger may be 3D printed using any number of materials. For example, the first heat exchanger may be 3D printed using copper, aluminum, titanium, gold, another thermally conducting material, or any combination thereof. As one example, the first heat exchanger is 3D printed using two or more materials (e.g., copper and aluminum).

In act 1204, at least a portion of a second heat exchanger is produced using additive manufacturing (e.g., 3D printing). The second heat exchanger is 3D printed directly on the first heat exchanger, such that the first heat exchanger and the second heat exchanger form a single contiguous component. The 3D printing may include depositing layers of material onto a power bed with inkjet printer heads. Alternatively or additionally, the 3D printing may include an extrusion-based process, a sintering-based process, or another process. The successive layers of material may be deposited under computer control based on a 3D model to produce the second heat exchanger.

The second heat exchanger may be 3D printed using any number of materials including, for example, copper, aluminum, titanium, gold, another thermally conducting material, or any combination thereof. As one example, the second heat exchanger is 3D printed using two or more materials (e.g., copper and aluminum).

The second heat exchanger is of a different type than the first heat exchanger. In one example, the second heat exchanger is a heat sink including a plurality of fins, and the plurality of fins are 3D printed directly on a surface of the first heat exchanger. In one example, the portion of the first heat exchanger is a fan housing, and in another example, the first heat exchanger is a heat spreader or a phase change device (e.g., a heat pipe or a vapor chamber).

As an example, 3D printing the plurality of fins includes 3D printing the plurality of fins on an outer surface of a phase change device. In another example, 3D printing the plurality of fins includes 3D printing the plurality of fins on a surface of a housing of a fan. For example, the plurality of fins may be 3D printed to be within the fan housing. Any number of other combinations of thermal management devices may be 3D printed as a single contiguous part.

In one example, at least a first fin and a second fin of the plurality of fins are 3D printed such that the second fin has a different shape, different size, different fin pitch, different density, different fin angle relative to a flow field, different fin thickness, or any combination thereof than the first fin. For example, the second fin, which is further away from a heat source (e.g., a processor) than the first fin, has a greater density than the first fin. Using 3D printing, the density of each fin of a subset of fins or the plurality of fins may be different and/or varied along at least a portion of the length of the fin.

The use of 3D printing unlocks the potential to manufacture designs previously unattainable or impractical using traditional manufacturing methods. Continuous and/or contiguous parts may be manufactured at a high resolution and in a time efficient manner.

While the present claim scope has been described with reference to specific examples, which are intended to be illustrative only and not to be limiting of the claim scope, it will be apparent to those of ordinary skill in the art that changes, additions and/or deletions may be made to the disclosed embodiments without departing from the spirit and scope of the claims.

The foregoing description is given for clearness of understanding only, and no unnecessary limitations should be understood therefrom, as modifications within the scope of the claims may be apparent to those having ordinary skill in the art.

In a first embodiment, a thermal management device includes a single contiguous component. The single contiguous component includes at least a portion of a first heat exchanger and at least a portion of a second heat exchanger. The second heat exchanger is of a different type than the first heat exchanger.

In a second embodiment, with reference to the first embodiment, the first heat exchanger is a phase change device, and the second heat exchanger is a heat sink. The heat sink includes fins extending away from the heat spreader.

In a third embodiment, with reference to the second embodiment, at least one of the fins includes a top, a bottom, and at least one side. The one fin extends away from the phase change device from the bottom to the top, along the length of the one fin. The one fin has a different density at the top of the one fin compared to the bottom of the one fin.

In a fourth embodiment, with reference to the first embodiment, the first heat exchanger is a heat pipe, and the second heat exchanger is a vapor chamber.

In a fifth embodiment, with reference to the first embodiment, the portion of the first heat exchanger includes a housing for a fan, and the second heat exchanger is a heat sink. The heat sink includes fins extending away from the housing for the fan.

In a sixth embodiment, with reference to the fifth embodiment, the fins include a first fin and a second fin. A shape, a size, a fin pitch, a fin angle relative to a flow field, a fin thickness, or any combination thereof of the first fin is different than a shape, a size, a fin pitch, a fin angle relative to a flow field, a fin thickness, or any combination thereof of the second fin.

In a seventh embodiment, with reference to the first embodiment, the first heat exchanger includes a plurality of first fins, and the second heat exchanger includes a plurality of second fins. A shape, a size, a fin pitch, a fin angle relative to a flow field, a fin thickness, or a combination thereof of each first fin of the plurality of first fins is different than a shape, a size, a fin pitch, a fin angle relative to a flow field, a fin thickness, or any combination thereof of each second fin of the plurality of second fins.

In an eighth embodiment, a computer system includes a housing and a computer device that generates heat during operation. The computer device is supported by the housing. The computer system also includes a single contiguous part supported by the housing. The single contiguous part includes a first heat exchanger and a second hear exchanger. At least a portion of the first heat exchanger is adjacent to the computer device. The first heat exchanger is a different type of heat exchanger than the second heat exchanger.

In a ninth embodiment, with reference to the eighth embodiment, the housing includes a first volume and a second volume. The second volume is at a distance from the first volume. At least a portion of the first heat exchanger is disposed in the first volume, and at least a portion of the second heat exchanger is disposed in the second volume.

In a tenth embodiment, with reference to the ninth embodiment, the first heat exchanger includes a phase change device, and the second heat exchanger includes a heat sink. The heat sink includes a plurality of fins. The phase change device extends from the first volume to the second volume.

In an eleventh embodiment, with reference to the tenth embodiment, the phase change device includes a vapor chamber, a heat pipe, or the vapor chamber and the heat pipe.

In a twelfth embodiment, with reference to the tenth embodiment, the housing includes an inner side. A subset of fins of the plurality of fins extend away from the phase change device and towards the inner side of the housing.

In a thirteenth embodiment, with reference to the twelfth embodiment, at least one fin of the subset of fins has a varied density along at least a portion of the length of the one fin. The varied density decreases along the portion of the length of the one fin in a direction away from the phase change device.

In a fourteenth embodiment, with reference to the twelfth embodiment, a first fin of the subset of fins has a first varied density distribution along the length of the first fin. A second fin of the subset of fins has a second varied density distribution along the length of the second fin. The second varied density distribution is different than the first varied density distribution.

In a fifteenth embodiment, with reference to the fourteenth embodiment, the first fin is closer to the computer device than the second fin. A minimum density or an average density of the second varied density distribution is greater than a minimum density or an average density of the first varied density distribution.

In a sixteenth embodiment, a method for manufacturing a thermal management device includes 3D printing a single contiguous component that includes at least a portion of a first heat exchanger and at least a portion of a second heat exchanger. The first heat exchanger is of a different type than the second heat exchanger.

In a seventeenth embodiment, with reference to the sixteenth embodiment, the second heat exchanger is a heat sink. The heat sink includes a plurality of fins. 3D printing the single contiguous component includes 3D printing the plurality of fins on a surface of the portion of the first heat exchanger.

In an eighteenth embodiment, with reference to the seventeenth embodiment, the portion of the first heat exchanger includes a housing of a fan, a heat spreader, or a phase change device.

In a nineteenth embodiment, with reference to the eighteenth embodiment, the portion of the first heat exchanger includes a phase change device. 3D printing the plurality of fins includes 3D printing the plurality of fins on an outer surface of the phase change device. 3D printing a first fin and a second fin of the plurality of fins includes 3D printing the first fin and the second fin, such that the second fin has a different shape, different size, different fin pitch, different fin angle relative to a flow field, different fin thickness, or any combination thereof than the first fin.

In a twentieth embodiment, with reference to the nineteenth embodiment, 3D printing the first fin and the second fin of the plurality of fins includes 3D printing the first fin and the second fin such that the first fin has a first varied density along at least a portion of the length of the first fin, and the second fin has a second varied density along at least a portion of the length of the second fin. The first varied density is different than the second varied density.

In connection with any one of the aforementioned embodiments, the thermal management device or the method for manufacturing the thermal management device may alternatively or additionally include any combination of one or more of the previous embodiments.

The foregoing description is given for clearness of understanding only, and no unnecessary limitations should be understood therefrom, as modifications within the scope of the claims may be apparent to those having ordinary skill in the art.

The invention claimed is:

1. A thermal management system device comprising:
a single contiguous component made of a single material, the single contiguous component comprising:
a heat spreader; and a heat sink comprising fins extending away from an external surface of the heat spreader,
wherein at least one of the fins has a varied density within and along at least a portion of a length of each of the at least one of the fins, the varied density decreasing along the portion of the length of each of the at least one of the fins in a direction away from the heat spreader, and
wherein each of the at least one of the fins has a first cross-section and a second cross-section in a direction perpendicular to the direction away from the heat spreader, the first cross-section being closer to the heat spreader than the second cross-section, a density of each cross-section of the first cross-section and the second cross-section being substantially uniform across each cross-section, the first cross-section having a greater density than the second cross-section.

2. The thermal management device of claim 1, wherein each of the at least one of the fins comprises a top, a bottom, and at least one side, each of the at least one of the fins extends away from the heat spreader from the bottom to the top, along the length of each of the at least one of the fins, and
wherein each of the at least one of the fins has a different density at the top of each of the at least one of the fins compared to the bottom of each of the at least one of the fins.

3. The thermal management device of claim 1, wherein the heat spreader comprises a vapor chamber, a heat pipe, or the vapor chamber and the heat pipe.

4. The thermal management device of claim 1, wherein the single contiguous component further comprises a housing for a fan,
wherein the fins extending away from the external surface of the heat spreader are first fins, and
wherein the heat sink further comprises second fins, the second fins extending away from the housing for the fan.

5. The thermal management device of claim 4, wherein the second fins comprise a third fin and a fourth fin, and
wherein a shape, a size, a fin pitch, a fin angle relative to a flow field, a fin thickness, or any combination thereof of the third fin is different than a shape, a size, a fin pitch, a fin angle relative to a flow field, a fin thickness, or any combination thereof of the fourth fin.

6. The thermal management device of claim 1, wherein the fins comprise a first fin and a second fin, and
wherein a shape, a size, a fin pitch, a fin angle relative to a flow field, a fin thickness, or any combination thereof of the first fin is different than a shape, a size, a fin pitch, a fin angle relative to a flow field, a fin thickness, or any combination thereof of the second fin.

7. The thermal management device of claim 1, wherein the heat spreader is a phase change device.

8. A computer system comprising:
a housing having an inner surface;
a computer device that generates heat during operation, the computer device being supported by the housing; and
a single contiguous part supported by the housing, the single contiguous part comprising a first heat exchanger and a second heat exchanger, at least a portion of the first heat exchanger being adjacent to the computer device,
wherein the first heat exchanger is a different type of heat exchanger than the second heat exchanger,
wherein the first heat exchanger comprises a vapor chamber, a heat pipe, or the vapor chamber and the heat pipe, and the second heat exchanger comprises a heat sink, the heat sink comprising fins extending away from an external surface of the vapor chamber, the heat pipe, or the vapor chamber and the heat pipe,
wherein a subset of the fins extend away from the vapor chamber, the heat pipe, or the vapor chamber and the heat pipe and towards the inner surface of the housing, wherein a first fin of the subset of fins has a first varied density distribution along a length of the first fin, and a second fin of the subset of fins has a second varied density distribution along a length of the second fin, the second varied density distribution being different than the first varied density distribution, and wherein the length of the first fin and the length of the second fin each extend away from the external surface of the vapor chamber, the heat pipe, or the vapor chamber and the heat pipe.

9. The computer system of claim 8, wherein the housing comprises a first volume and a second volume, the second volume being at a distance from the first volume, and wherein at least a portion of the first heat exchanger is disposed in the first volume, and at least a portion of the second heat exchanger is disposed in the second volume.

10. The computer system of claim 9, wherein the vapor chamber, the heat pipe, or the vapor chamber and the heat pipe extend from the first volume to the second volume.

11. The computer system of claim 8, wherein the first varied density distribution decreases along the length of the first fin in a direction away from the vapor chamber, the heat pipe, or the vapor chamber and the heat pipe, the second varied density distribution decreases along the length of the second fin in a direction away from the vapor chamber, the heat pipe, or the vapor chamber and the heat pipe, or a combination thereof.

12. The computer system of claim 8, wherein the first fin is closer to the computer device than the second fin, and wherein a minimum density or an average density of the second varied density distribution is greater than a minimum density or an average density of the first varied density distribution.

13. The computer system of claim 8, wherein the subset of the fins includes all of the fins.

14. A method for manufacturing a thermal management device, the method comprising:

three-dimensional (3D) printing a single contiguous component comprising at least a portion of a first heat exchanger and at least a portion of a second heat exchanger, wherein the first heat exchanger is of a different type than the second heat exchanger, wherein the portion of the first heat exchanger comprises a vapor chamber, a heat pipe, or the vapor chamber and the heat pipe, and the portion of the second heat exchanger comprises a heat sink, the heat sink comprising fins extending away from an external surface of the vapor chamber, the heat pipe, or the vapor chamber and the heat pipe, wherein 3D printing the single contiguous component comprises 3D printing a first fin of the fins and a second fin of the fins such that the first fin has a first varied density along at least a portion of a length of the first fin, and the second fin has a second varied density along at least a portion of a length of the second fin, the first varied density being different than the second varied density, and wherein the length of the first fin and the length of the second fin each extend away from the external surface of the vapor chamber, the heat pipe, or the vapor chamber and the heat pipe.

15. The method of claim 14, wherein 3D printing the single contiguous component comprises 3D printing the fins on the external surface of the vapor chamber, the heat pipe, or the vapor chamber and the heat pipe.

16. The method of claim 15, wherein the portion of the first heat exchanger further comprises a heat spreader or a housing of a fan.

17. The method of claim 16, wherein 3D printing the single contiguous component further comprises 3D printing a third fin of the fins and a fourth fin of the fins, such that the fourth fin has a different shape, different size, different fin pitch, different fin angle relative to a flow field, different fin thickness, or any combination thereof than the third fin.

* * * * *